United States Patent [19]
Moden

[11] Patent Number: 5,960,258
[45] Date of Patent: Sep. 28, 1999

[54] UNDERFILL COATING FOR LOC PACKAGE

[75] Inventor: Walter L. Moden, Meridian, Id.

[73] Assignee: Micron Technology, Inc., Boise, Id.

[21] Appl. No.: 08/915,422

[22] Filed: Aug. 20, 1997

Related U.S. Application Data

[63] Continuation of application No. 08/651,984, May 21, 1996, Pat. No. 5,733,800.

[51] Int. Cl.⁶ .......................... H01L 21/44; H01L 21/48; H01L 21/50
[52] U.S. Cl. .......................... 438/106; 438/118; 438/123; 438/124
[58] Field of Search .................... 438/106, 123, 438/124, 118

[56] References Cited

U.S. PATENT DOCUMENTS

| | | | |
|---|---|---|---|
| 4,722,470 | 2/1988 | Johary | 438/106 |
| 4,862,245 | 8/1989 | Pashby et al. | |
| 4,942,140 | 7/1990 | Ootsuki et al. | |
| 4,984,059 | 1/1991 | Kubota et al. | |
| 5,071,787 | 12/1991 | Mori et al. | |
| 5,106,784 | 4/1992 | Bednarz | 438/124 |
| 5,120,665 | 6/1992 | Tsukagoshi et al. | |
| 5,184,208 | 2/1993 | Sakuta et al. | |
| 5,252,853 | 10/1993 | Michii | |
| 5,286,679 | 2/1994 | Farnworth et al. | |
| 5,304,842 | 4/1994 | Farnworth et al. | |
| 5,318,926 | 6/1994 | Dlugokecki | 438/124 |
| 5,358,598 | 10/1994 | Chiu | |
| 5,358,904 | 10/1994 | Murakami et al. | |
| 5,358,906 | 10/1994 | Lee | |
| 5,371,044 | 12/1994 | Yoshida et al. | |
| 5,385,869 | 1/1995 | Liu et al. | |
| 5,409,866 | 4/1995 | Sato et al. | 438/123 |
| 5,432,127 | 7/1995 | Lamson et al. | |
| 5,434,106 | 7/1995 | Lim et al. | 438/123 |
| 5,455,200 | 10/1995 | Bigler et al. | |
| 5,461,255 | 10/1995 | Chan et al. | |
| 5,535,509 | 7/1996 | Tomita et al. | 438/123 |
| 5,658,831 | 8/1997 | Layton et al. | 438/118 |
| 5,710,071 | 1/1998 | Beddingfield et al. | 438/126 |
| 5,733,800 | 3/1998 | Moden | |

*Primary Examiner*—Kevin M. Picardat
*Assistant Examiner*—Devin Collins
*Attorney, Agent, or Firm*—Trask, Britt & Rossa

[57] ABSTRACT

An LOC die assembly is disclosed including a die dielectrically adhered to the underside of a lead frame. An underfill material is introduced between each lead finger and semiconductor die, extending from the bonding location of the die and the edge of the die, in order to prevent filler particles from lodging between the leads and the active surface of the die during transfer molding of a plastic encapsulant. The seal created by the underfill material reduces point stresses on the active surface of the die usually caused by the filler particles. The decreased flexure in the leads further enhances the locking of the leads in position with respect to the die.

24 Claims, 11 Drawing Sheets

SECTION E-E

SECTION E-E

SECTION E-E

UNDERFILL COATING FOR LOC PACKAGE

This is a continuation of application Ser. No. 08/651,984, filed May 21, 1996, U.S. Pat. No. 5,733,800.

BACKGROUND OF THE INVENTION

1. Field of the Invention

The invention pertains to a "leads over chip" (LOC) semiconductor die assembly, and more particularly to a method and apparatus for reducing the stress resulting from lodging of filler particles present in plastic encapsulants between the undersides of the lead frame leads and the active surface of the die and improved lead locking of the leads in position over a portion of the active surface of a semiconductor die assembly.

2. State of the Art

The use of LOC semiconductor die assemblies has become relatively common in the industry in recent years. This style or configuration of semiconductor device replaces a "traditional" lead frame with a central, integral support (commonly called a die-attach tab, paddle, or island) to which the back surface of a semiconductor die is secured, with a lead frame arrangement wherein the dedicated die-attach support is eliminated and at least some of the leads extend over the active surface of the die. The die is then adhered to the lead extensions with an adhesive dielectric layer of some sort disposed between the undersides of the lead extensions and the die. Early examples of LOC assemblies are illustrated in U.S. Pat. No. 4,862,245 to Pashby et al. and U.S. Pat. No. 4,984,059 to Kubota et al. More recent examples of the implementation of LOC technology are disclosed in U.S. Pat. Nos. 5,184,208; 5,252,853; 5,286,679; 5,304,842; and 5,461,255. In instances known to the inventors, LOC assemblies employ large quantities or horizontal cross-sectional areas of adhesive to enhance physical support of the die for handling.

Traditional lead frame die assemblies using a die-attach tab place the inner ends of the lead frame leads in close lateral proximity to the periphery of the active die surface where the bond pads are located, wire bonds then being formed between the lead ends and the bond pads. LOC die assemblies, by their extension of inner lead ends over the die, permit physical support of the die from the leads themselves, permit more diverse (including centralized) placement of the bond pads on the active surface, and permit the use of the leads for heat transfer from the die. However, use of LOC die assemblies in combination with plastic packaging of the LOC die assembly has demonstrated some shortcomings of LOC technology as presently practiced in the art.

One of the shortcomings of the prior art LOC semiconductor die assemblies is that the tape used to bond to the lead fingers of the lead frame does not adequately lock the lead fingers in position for the wire bonding process. At times, the adhesive on the tape is not strong enough to fix or lock the lead fingers in position for wire bonding as the lead fingers pull away from the tape before wire bonding. Alternately, the lead fingers will pull away from the tape after wire bonding of the semiconductor die but before encapsulation of the semiconductor die and frame, either causing shorts between adjacent wire bonds or the wire bonds to pull loose from either the bond pads on the die or lead fingers of the frame. While wire bonding fixtures may be used to attempt to overcome these problems, the fixtures and their use add cost to the fabrication process. Additionally, if large amounts of tape are used to fix the lead fingers in place, the reliability performance of the packaged device will be affected as tape absorbs moisture from the surrounding environment causing problems during encapsulation and potential corrosion problems.

After wire bonding the semiconductor die to the lead fingers of the lead frame, forming an assembly, the most common manner of forming a plastic package about a die assembly is molding and, more specifically, transfer molding. In this process (and with specific reference to LOC die assemblies), a semiconductor die is suspended by its active surface from the underside of inner lead extensions of a lead frame (typically Cu or Alloy 42) by a tape, screen print or spin-on dielectric adhesive layer. The bond pads of the die and the inner lead ends of the frame are then electrically connected by wire bonds (typically Au, although Al and other metal alloy wires have also been employed) by means known in the art. The resulting LOC die assembly, which may comprise the framework of a dual-in-line package (DIP), zig-zag in-line package (ZIP), small outline j-lead package (SOJ), quad flat pack (QFP), plastic leaded chip carrier (PLCC), surface mount device (SMD) or other plastic package configuration known in the art, is placed in a mold cavity and encapsulated in a thermosetting polymer which, when heated, reacts irreversibly to form a highly cross-linked matrix no longer capable of being resmelted.

The thermosetting polymer generally is comprised of three major components: an epoxy resin, a hardener (including accelerators), and a filler material. Other additives such as flame retardants, mold release agents and colorants are also employed in relatively small amounts.

While many variations of the three major components are known in the art, the focus of the present invention resides in the filler materials employed and its effects on the active die surface and improved lead locking of the lead fingers of the frame.

Filler materials are usually a form of fused silica, although other materials such as calcium carbonates, calcium silicates, talc, mica and clays have been employed for less rigorous applications. Powdered, fused quartz is currently the primary filler used in encapsulants. Fillers provide a number of advantages in comparison to unfilled encapsulants. For example, fillers reinforce the polymer and thus provide additional package strength, enhance thermal conductivity of the package, provide enhanced resistance to thermal shock, and greatly reduce the cost of the polymer in comparison to its unfilled state. Fillers also beneficially reduce the coefficient of thermal expansion (CTE) of the composite material by about fifty percent in comparison to the unfilled polymer, resulting in a CTE much closer to that of the silicon or gallium arsenide die. Filler materials, however, also present some recognized disadvantages, including increasing the stiffness of the plastic package, as well as the moisture permeability of the package.

Another previously unrecognized disadvantage discovered by the inventors herein is the damage to the active die surface resulting from encapsulant filler particles becoming lodged or wedged between the underside of the lead extensions and the active die surface during transfer molding of the plastic package about the die and the inner lead ends of the LOC die assembly. The filler particles, which may literally be jammed in position due to deleterious polymer flow patterns and flow imbalances in the mold cavity during encapsulation, place the active die surface under residual stress at the points of contact of the particles. The particles may then damage the die surface or conductive elements thereon or immediately thereunder when the package is further stressed (mechanically, thermally, electrically) during post-encapsulation handling and testing.

While it is possible to employ a lower volume of filler in the encapsulating polymer to reduce potential for filler particle lodging or wedging, a drastic reduction in filler volume raises costs of the polymer to unacceptable levels. More importantly, if the volume of the filler in the encapsulating polymer is reduced, as more polymer is used, the reliability of the encapsulated part is affected as the polymer tends to absorb moisture and is more permeable to moisture, thereby causing a variety of problems for the encapsulated part during encapsulation and subsequent use. Currently available filler technology also imposes certain limitations as to practical beneficial reductions in particle size (currently in the 75 to 125 micron range, with the larger end of the range being easier to achieve with consistency) and in the shape of the filler particles. While it is desirable that particles be of generally spherical shape, it has thus far proven impossible to eliminate non-spherical flakes or chips which, in the wrong orientation, maximize stress on the die surface.

Ongoing advances in design and manufacturing technology provide increasingly thinner conductive, semiconductive and dielectric layers in state-of-the-art dice, and the width and pitch of conductors serving various purposes on the active surface of the die are likewise being continually reduced. The resulting die structures, while robust and reliable for their intended uses, must nonetheless become more stress-susceptible due to the minimal strength provided by the minute widths, depths and spacings of their constituent elements. The integrity of active surface die coats such as silicon dioxide, doped silicon dioxides such as phosphorous silicate glass (PSG) or borophosphorous silicate glass (BPSG), or silicon nitride, may thus be compromised by point stresses applied by filler particles, the result being unanticipated shortening of device life if not immediate, detectable damage or alteration of performance characteristics.

The aforementioned U.S. Pat. No. 4,984,059 to Kubota et al. does incidentally disclose several exemplary LOC arrangements which appear to greatly space the leads over the chip or which do not appear to provide significant areas for filler particle lodging. However, such structures may create fabrication and lead spacing and positioning difficulties.

In addition to solving the problems associated with filler particle lodging and damage, it is desirable to have improved lead locking of the lead fingers of the frame during operations involving the semiconductor die. If the gaps between the lead fingers and the semiconductor die are sealed with an underfill material, the adhesive used to bond the lead fingers to the semiconductor die is more effective in locking the lead fingers in position. Furthermore, the use of an underfill material, in addition to the tape, screen print or spin-on dielectric adhesive layer, provides an additional stabilizing means to immobilize the lead fingers in position, thus reducing or eliminating localized stress failures occurring during the transfer molding process. Previously, improving lead finger locking has been approached from the perspective of improved adhesives and by increasing the flexibility of the lead fingers, rather than sealing the gaps between the leadfingers and the semiconductor die.

From the foregoing, the prior art has neither provided for improved locking of the lead fingers to the semiconductor die, nor recognized the stress phenomenon attendant to transfer molding and the use of filled encapsulants, nor provided an LOC structure which beneficially accommodates this phenomenon.

SUMMARY OF THE INVENTION

The present invention provides a lead-supported die assembly for an LOC arrangement that substantially reduces the stress that may otherwise potentially form between the leads and the active die surface due to the presence of filler particles of the polymer encapsulant and improved lead locking of the leads in position over a portion of the active surface of a semiconductor die assembly. Accordingly, an underfill material is introduced in the gap between each lead finger and semiconductor die, between the bonding location of the die and the edge of the die, to underfill and seal the gap. After the underfill material is cured, the compound filler is prevented from flowing into the gaps. Accordingly, a stacking of filler particles in which the filler particles try to force the lead away from the die thus causing stress in the connection between the lead and the die is prevented or reduced. Moreover, the underfill material substantially immobilizes the lead fingers and reduces the stress created during the transfer molding process as well as other processes. The resulting exclusion of filler material from the gap will effectively eliminate or reduce the residual stress typically experienced by the active die surface in conventional LOC assemblies. This lessened residual stress is carried forward in the encapsulated package after cure, permitting the package to better withstand the stresses of post-encapsulation handling and testing, including the elevated potentials and temperatures experienced during burn-in, without adverse effects. The resulting lead stability also improves lead finger locking to the tape as less force is transferred to the tape from the lead fingers, which force may cause the lead fingers to become dislodged therefrom prior to the wire bonding operations or, subsequently, during encapsulation of the assembly.

The LOC apparatus of the present invention comprises a lead frame to which the active surface of a die is adhered by a LOC tape, permitting the lead frame to physically support the die during pre-encapsulation handling and processing, such as wire bonding. The gap found between the lead finger and the semiconductor die is sealed with an underfill material. With such an arrangement, intrusion of filler particles between the inner lead ends and the active surface of the die during the encapsulation process is effectively prevented.

Stated in more specific terms and on the scale of an individual lead and the underlying active surface of the die, an underfill material is introduced onto the semiconductor die at a location near the lead finger. More specifically, the underfill material may be introduced nearby the lead axis between the location of the dielectric adhesive (such as LOC tape, screen print or spin-on, as known in the art) disposed on the underside of a lead and the edge of the die. The underfill material will migrate into and fill the gap by way of capillary action. The underfill prevents filler particles from flowing into the gaps so as to substantially eliminate the stress created by filler particles wedged or lodged between the lead finger and the die. The underfill also enhances the stability of the free end of the lead finger, so as to immobilize the lead finger during the die assembly molding process.

Although the die assembly and method of assembly of the present invention have been described in relation to several preferred embodiments, it is believed that major advantages of the assembly and method according to the invention are sealing the gaps between the lead fingers and the semiconductor die in order to prevent the lodging of damaging filler particles, and immobilizing the free ends of the lead fingers so as to eliminate localized stress failures resulting during the encapsulation process and during post-encapsulation handling and testing. These and other features of the present invention will become apparent from the following detailed description taken in conjunction with the accompanying drawings, and as defined by the appended claims.

DETAILED DESCRIPTION OF THE ILLUSTRATED EMBODIMENT

So that the reader may inmore fully understand the present invention in the context of the prior art, it seems appropriate to provide a brief description of a transfer apparatus and method for forming a plastic package about an LOC die assembly. The term "transfer" molding is descriptive of this process as the molding compound, once melted, is transferred under pressure to a plurality of remotely-located mold cavities containing die assemblies to be encapsulated.

Figure 1:
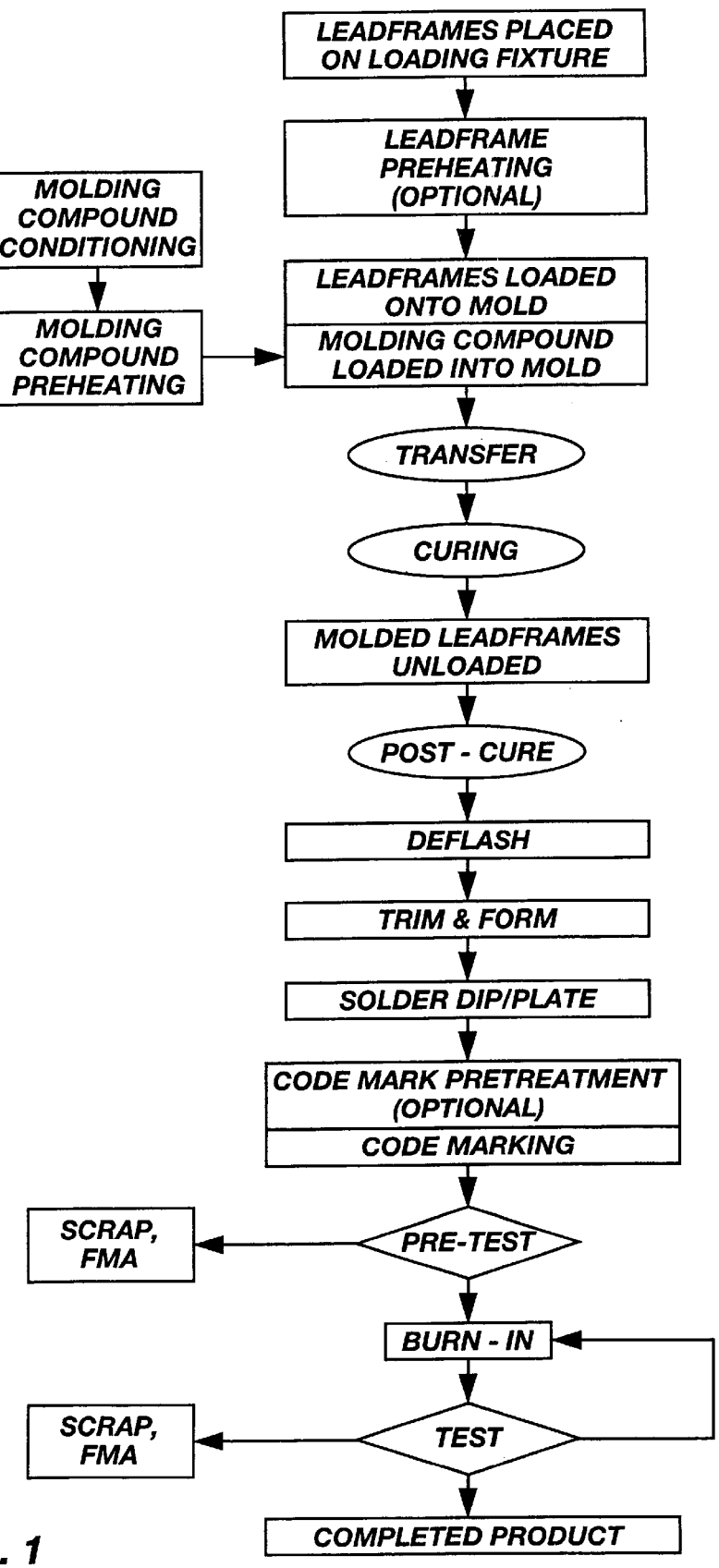
FIG. 1 comprises a flow chart of an exemplary process sequence for plastic package molding.

FIG. 1 is a flow chart of a typical process sequence for plastic package molding. It should be noted that the solder dip/plate operation has been shown as one step for brevity; normally plating would occur prior to trim and form.

Figure 2A:
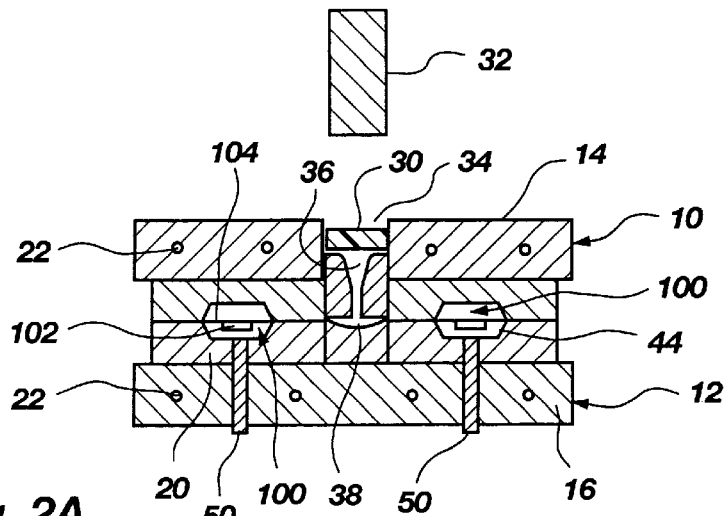
FIGS. 2A and 2B are side schematic views of a typical transfer molding, showing pre-molding and post-molding encapsulant positions.
Figure 2B:
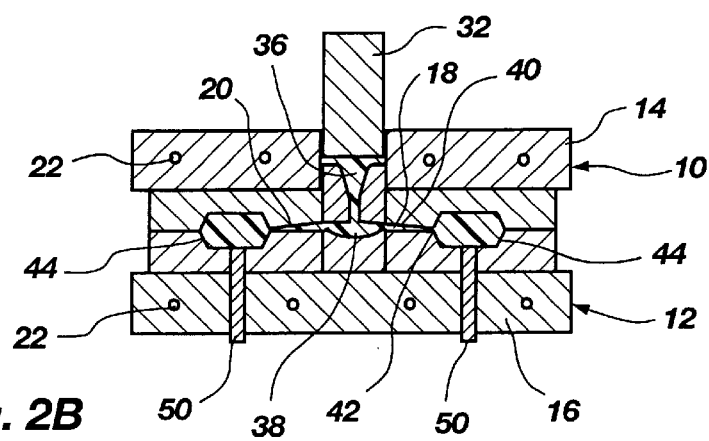
Figure 3:
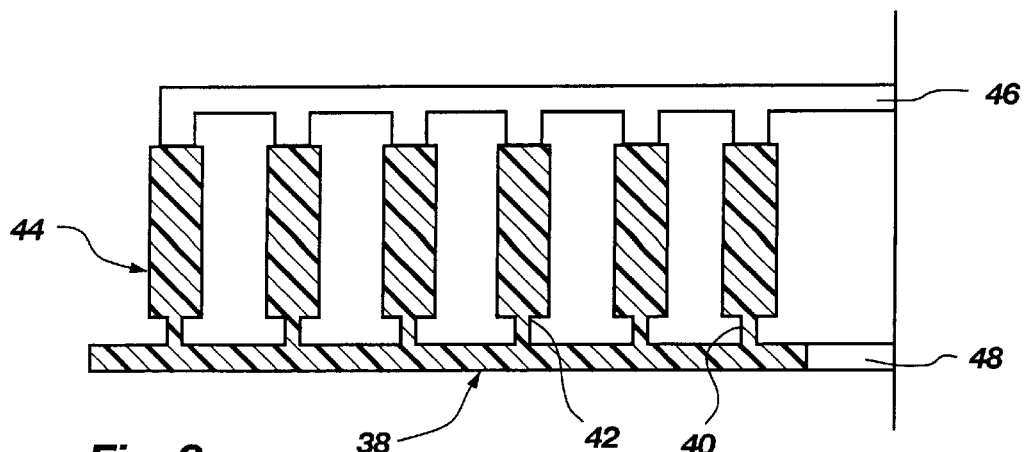
FIG. 3 shows a top schematic view of one side of a transfer mold of FIGS. 2A and 2B, depicting encapsulant flow and venting of the primary mold runner and the mold cavities wherein the die assemblies are contained.

FIGS. 2A and 2B show pre-molding and post-molding positions of encapsulant during a transfer molding operation using a typical mold apparatus comprising upper and lower mold halves 10 and 12, each mold half including a platen 14 or 16 with its associated chase 18 or 20. Heating elements 22 are employed in the platens to maintain an elevated and relatively uniform temperature in the runners and mold cavities during the molding operation. FIG. 3 shows a top view of one side of the transfer mold apparatus of FIGS. 2A and 2B. In the transfer mold apparatus shown, the encapsulant flows into each mold cavity 44 through the short end thereof.

In operation, a heated pellet of resin mold compound 30 is disposed beneath ram or plunger 32 in pot 34. The plunger descends, melting the pellet and forcing the melted encapsulant down through sprue 36 and into primary runner 38, from which it travels to transversely-oriented secondary runners 40 and across gates 42 into and through the mold cavities 44 through the short side thereof flowing across the die assemblies 100, wherein die assemblies 100 comprising dies 102 with attached lead frames 104 are disposed (usually in strips so that a strip of six lead frames, for example, would be cut and placed in and across the six cavities 44 shown in FIG. 3). Air in the runners 38 and 40 and mold cavities 44 is vented to the atmosphere through vents 46 and 48. At the end of the molding operation, the encapsulant is "packed" by application of a higher pressure to eliminate voids and reduce non-uniformities of the encapsulant in the mold cavities 44. After molding, the encapsulated die assemblies are ejected from the cavities 44 by ejector pins 50, after which they are post-cured at an elevated temperature to complete cross-linking of the resin, followed by other operations as known in the art and set forth in FIG. 1 by way of example. It will be appreciated that other transfer molding apparatus configurations, as well as variations in the details of the described method, are known in the art. However, none of such are pertinent to the invention, and so will not be discussed herein.

Figure 4A:
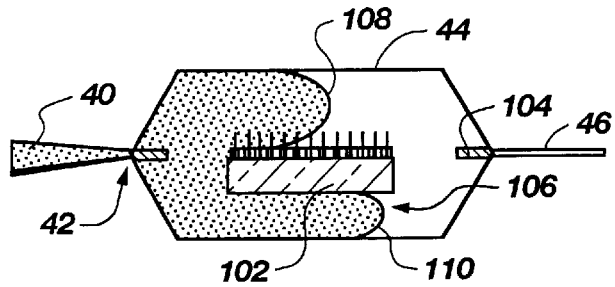
FIGS. 4A, 4B and 4C depict encapsulant flow scenarios for a mold cavity.
Figure 4B:
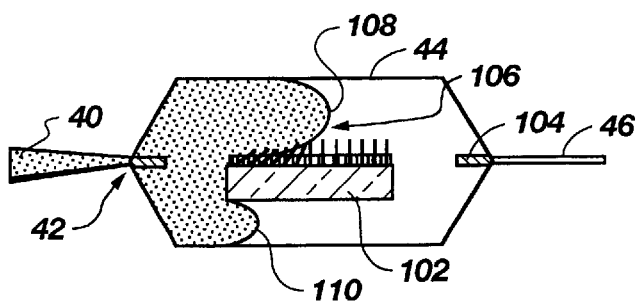
Figure 4C:
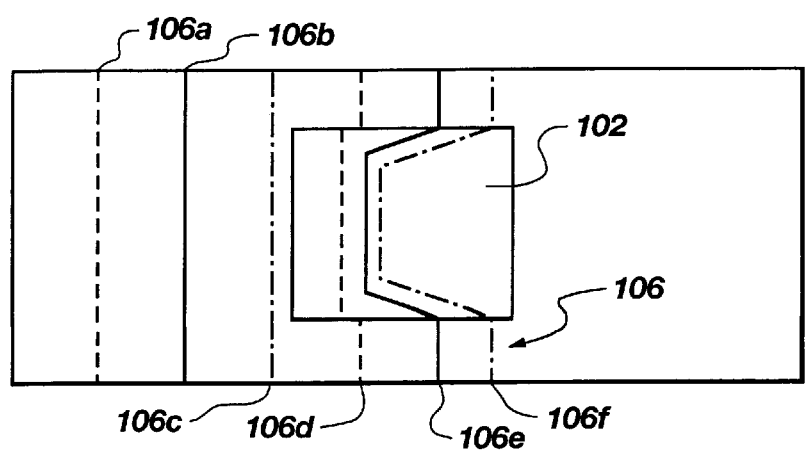

Encapsulant flow in the mold cavities 44 is demonstrably non-uniform. The presence of the die assembly 100 comprising a die 102 with lead frame 104 disposed across the mid-section of a cavity 44 splits the viscous encapsulant flow front 106 into upper 108 and lower 110 components. Further, the presence of the (relatively) large die 102 with its relatively lower temperature in the middle of a cavity 44 permits the flow front on each side of the die 102 to advance ahead of the flow front which passes over and under the die 102. FIGS. 4A and 4B show two mold cavity encapsulant flow scenarios where, respectively, the lower flow front 110 and the upper flow front 108 lead the overall encapsulant flow front 106 in the cavity 44 containing the die assembly 100. FIG. 4C depicts the advance of a flow front 106 from above, before and after a die 102 is encountered, the flow being depicted as time-separated, instantaneous flow fronts 106a, 106b, 106c, 106d, 106e and 106f.

Encapsulant filler particles, as noted above, become lodged between lead ends and the underlying die surfaces. The non-uniform flow characteristics of the viscous encapsulant flow, as described above, may cause (in addition to other phenomena, such as wire sweep, which are not relevant to the invention) particles to be more forcefully driven between the leads and the die and wedged or jammed in place in low-clearance areas. As the encapsulant flow front advances and the mold operation is completed by packing the cavities, pressure in substantially all portions of the cavities reaches hydrostatic. With prior art lead and adhesive LOC arrangements, the relative inflexibility of the tightly-constrained (adhered) lead ends maintains the point stresses of the particles trapped under the leads. These residual stresses are carried forward in the fabrication process to post-cure and beyond. When mechanical, thermal or electrical stresses attendant to post-encapsulation processing are added to the residual point stresses associated with the lodged filler particles, cracking or perforation of the die coat may occur, with the adverse effects previously noted. It has been observed that filler particle-induced damage occurs more frequently in close proximity to the adhesive, where lead flexure potential is at its minimum.

Figure 5A:
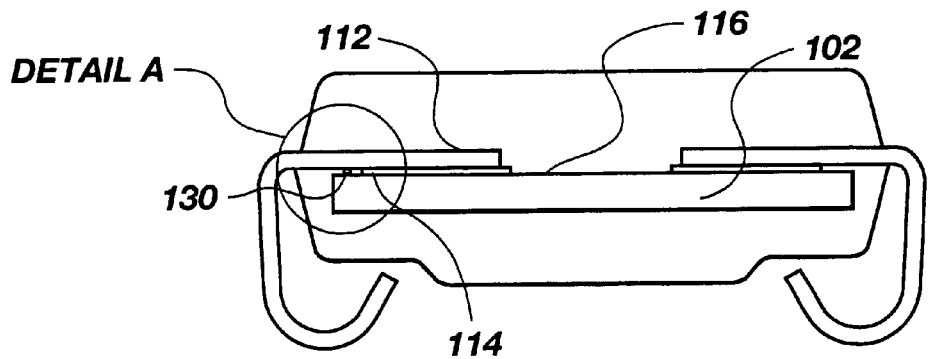
FIGS. 5A and 5B depict cross-sectional side views of prior art packaged SOJ semiconductor devices.
Figure 5B:
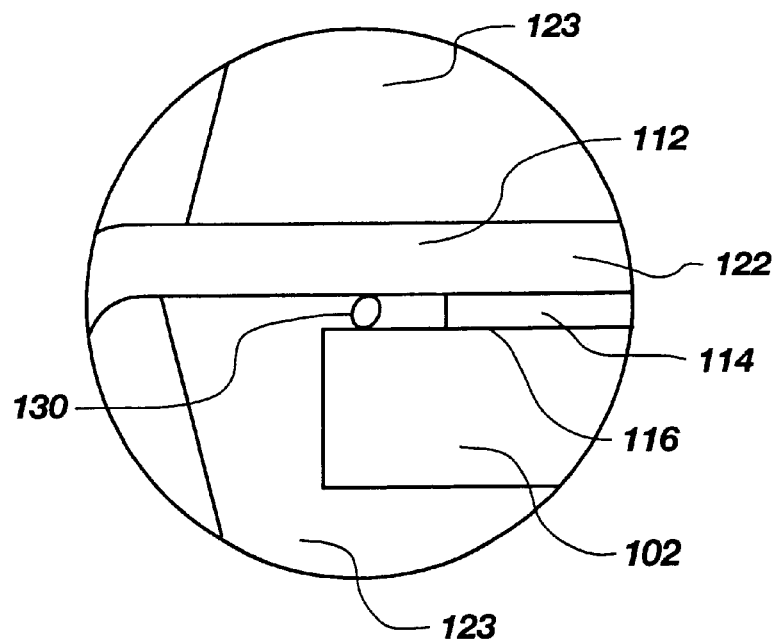

To graphically illustrate the above description of particle lodging, FIG. 5A depicts a prior art packaged LOC assembly wherein a single lead 112 extends over a die 102, with a segment of dielectric adhesive 114, in this instance a piece of Kapton® polyamide tape, adhered to both the lead 112 and the active surface 116 of the die. As better illustrated in FIG. 5B (DETAIL A), filler particle 130, which is part of the packaging material 123, is lodged between lead 112 and die active surface 116. It is clear that the lead end 122 is tightly constrained from movement by the inflexibility of the attachment of the lead end 122 to the die 102 by the adhesive 114. Moreover, the relative closeness of the lead 112 to the die active surface 116 and the inability of the lead 112 to flex or relax to reduce stress occasioned by the presence of the filler particle 130 may continue even after the encapsulant has reached hydrostatic balance such that the filler particle 130 may become tightly lodged between the lead 112 and the die active surface 116.

Figure 6A:
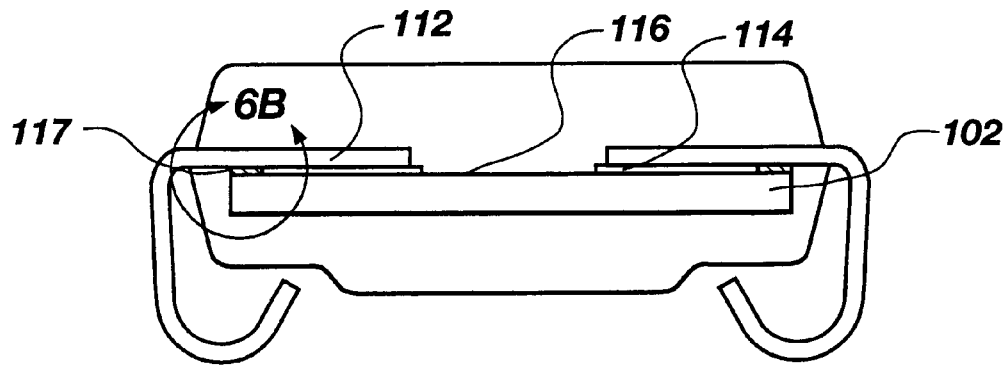
FIGS. 6A and 6B depict cross-sectional side views of an embodiment of a packaged SOJ semiconductor device according to the present invention.
Figure 6B:
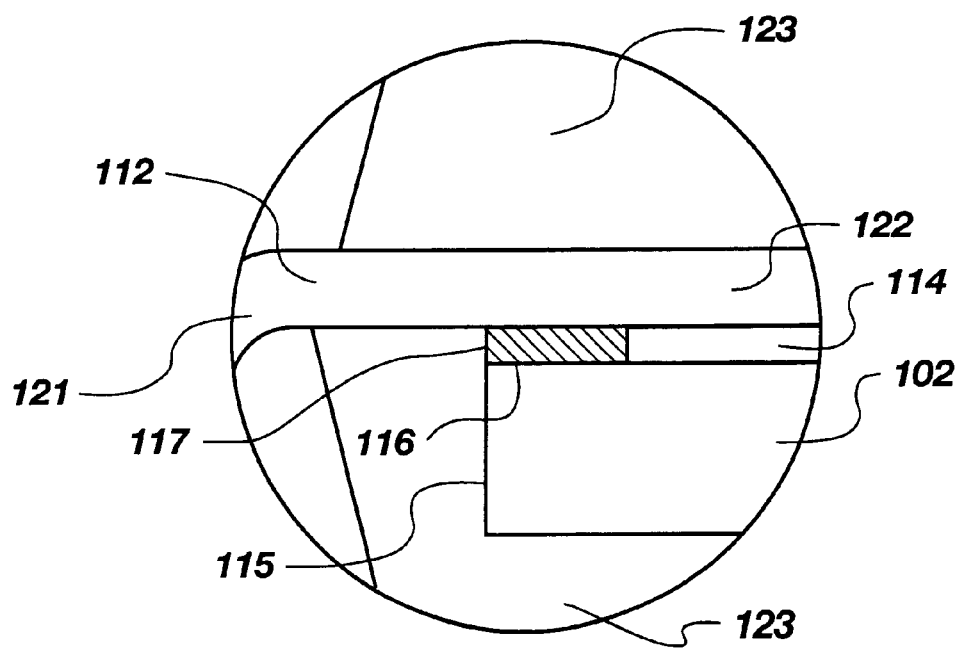

FIG. 6A, and in better detail FIG. 6B, depicts, in contrast to the prior art, a packaged LOC arrangement according to the present invention, wherein a single lead end 122 also extends over die 102. In addition to disposing an adhesive layer 114 between the underside of the lead 112 and the active surface 116 of the die 102, an underfill material 117 is applied between the underside of the lead 112 and the active surface 116 of the die 102 and between the adhesive 114 and the side 115 of the die 102. As more fully set forth below (see discussion of FIGS. 9, 10, and 11), various methods of underfilling may be utilized to seal the gap. The underfill 117 fills and seals the gap found between the underside of lead 112 and the active surface 116 of the die 102. Thus, a filler particle 130, of the same size and shape as that shown with respect to the prior art, is prevented from entering and becoming lodged between the lead 112 and the active surface 116. Moreover, the stacking of such particles 130 to create a similar lodging effect, also as seen in the prior art, is likewise prevented.

Additionally, because the underfill 117 (after curing) forms a substantially rigid link between a longitudinal length of the lead 112 and the corresponding active surface 116 of the die 102, the free end 121 of the lead 112 is substantially immobilized and prevented from flexing, twisting, or bending away from the active surface 116. Thus, in addition to eliminating point stresses caused by trapped particles, the resulting relatively inflexible and tightly-constrained lead 112 reaches a steady state position before being subjected to non-uniform flow characteristics, which can create additional stresses such as wire sweep, during the encapsulation or molding procedure. The added lead stability afforded by the underfill also reduces mechanical, thermal, and electrical stresses attendant to post-encapsulation processing. Furthermore, the incorporation of the underfill 117 results in less force being transferred to the adhesive 114 from the lead end 122, said force potentially causing a dislodgment of a lead 112 from the adhesive 114 prior to the wire bonding operation or during the encapsulation process.

Figure 7A:
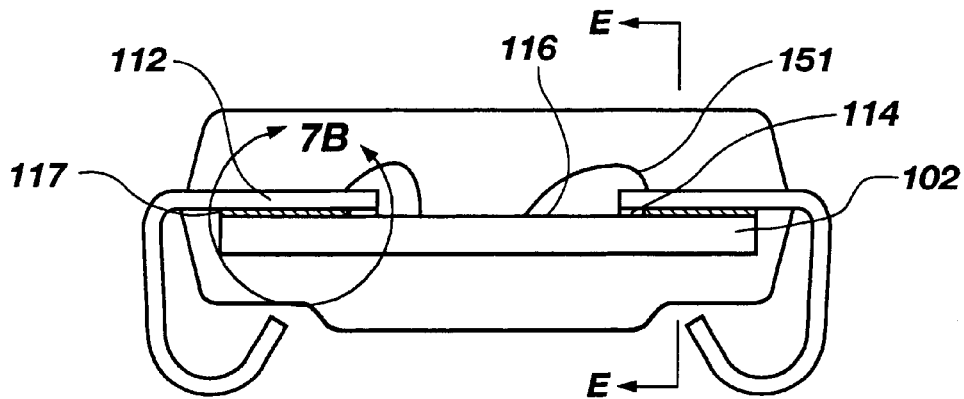
FIGS. 7A and 7B depict cross-sectional side views of another embodiment of a packaged SOJ semiconductor device according to the present invention.
Figure 7B:
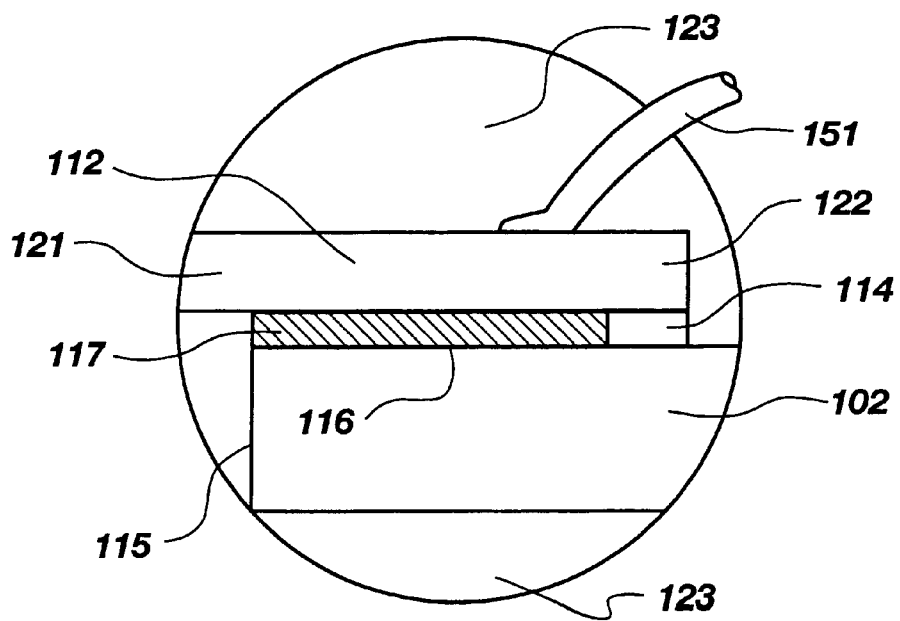

FIGS. 7A and 7B depict an alternative arrangement according to the present invention, wherein the adhesive 114 disposed between the underside of the lead 112 and the active surface 116 covers a shorter longitudinal portion of the underside of the lead 112. As in the embodiment shown in FIGS. 6A and 6B, an underfill 117 is applied to fill and seal the gap formed between the underside of the lead 112 and the active surface 116 of the die 102 and extends from the adhesive 114 to the side 115 of the die 102. As a result of the underfill-enhanced lead 112, stability and the ensuing reduction in lead-adhesive force transferral, a smaller amount of adhesive 114 (e.g. a narrower strip of tape) is required to adequately bond the lead 112 to the active surface 116 of the die 102. Additionally, or in the alternative, due to the underfill-enhanced lead 112 stability, a lead-die bond of sufficient strength can be obtained through the use of an adhesive 114 of lower strength than that required in "traditional" LOC assemblies currently utilized in the industry. While the amount of underfill 117 in the present embodiment is proportionally increased in relation to the amount of adhesive 114 being used, this arrangement likewise prevents filler particles from flowing into the gaps. Also shown, are wires 151 connecting leads 112 to bond pads (not shown) on active surface 116 of die 102.

Figure 8A:
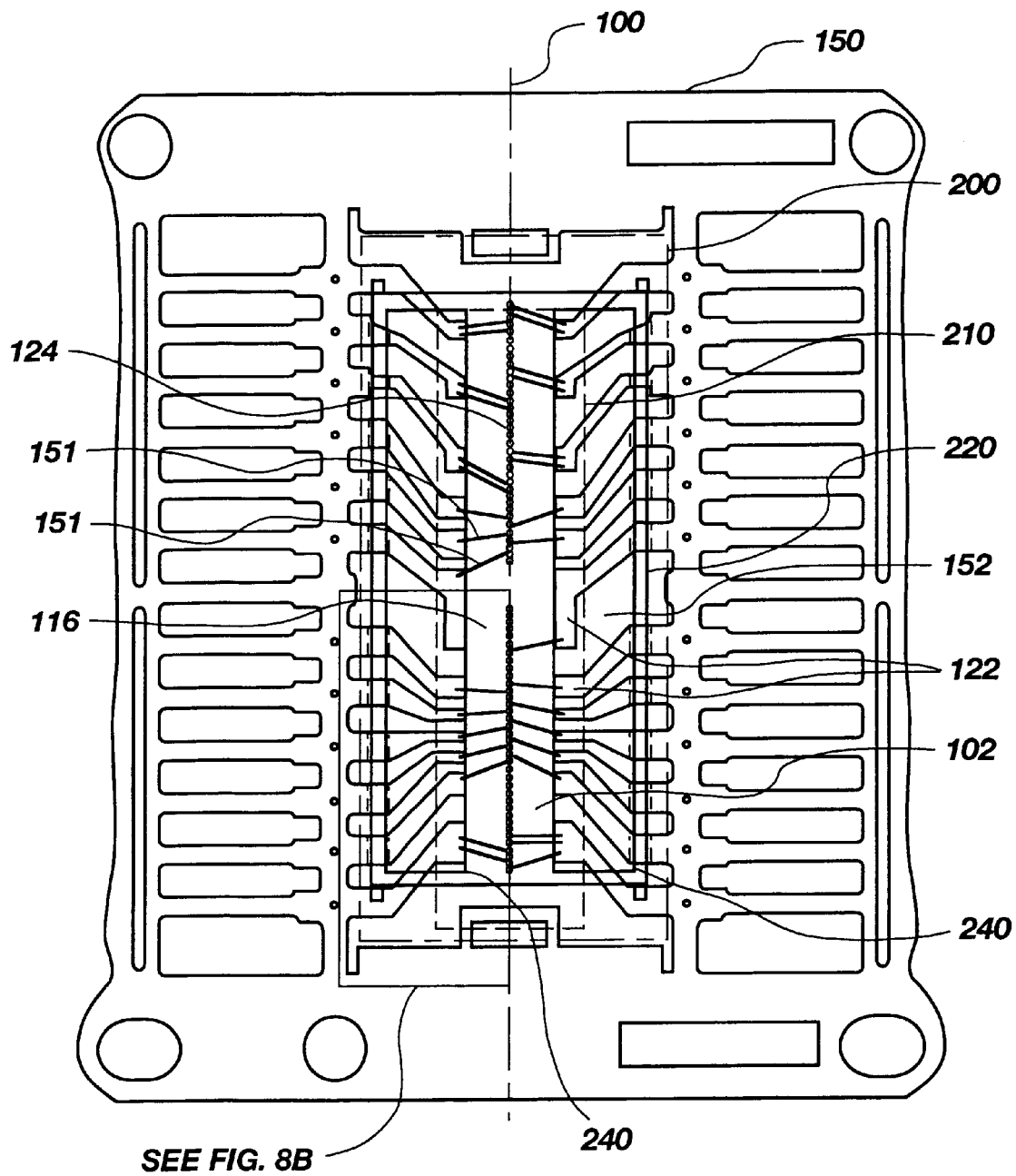
FIGS. 8A and 8B depict top views of a lead frame according to the present invention.
Figure 8B:
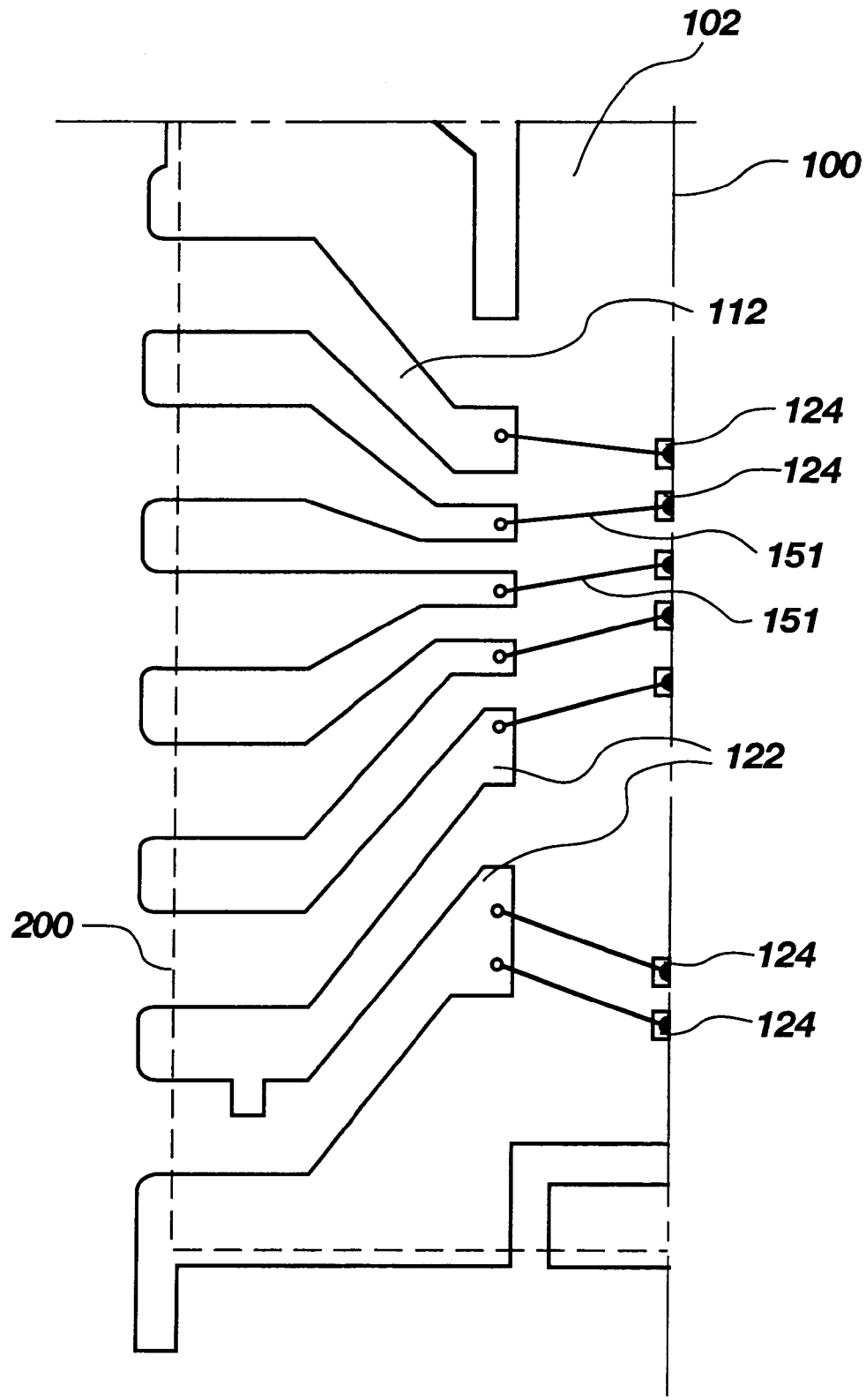

FIGS. 8A and 8B depict views of a lead frame and associated die in accordance with the present invention. For purposes of clarity and perspective, the inner, solid line 220 in FIG. 8A is the periphery of the die onto which the lead frame is superimposed and to which the lead frame is adhesively secured. In FIGS. 8A and 8B, double-dashed line 200 is the outer lateral border of the plastic package to be molded on each lead frame. In FIG. 8A, dashed line 210 represents the portion of the lead ends 122 that are typically plated. The periphery of the adhesive segments disposed between certain leads or buses and the die are represented by inner, solid lines 240. For purposes of illustration, the semiconductor die as illustrated comprises memory devices, such as dynamic random access memory (DRAM), or static random access memory (SRAM), although the invention has equal utility to any semiconductor device wherein an LOC arrangement is employed.

FIG. 8A depicts an arrangement wherein a lead frame 150, superimposed on a die 102, is secured thereto with dielectric adhesive strips or elongated segments 152 running along each side of active die surface 116. The inner lead ends 122 of the leads 112 thus extend inwardly over adhesive segments 152 toward a row of bond pads 124 running along the center 100 of the die 102. The inner lead ends 122 are then wirebonded to the bond pads by wires 151.

Once the inner lead ends 122 are wirebonded to the bond pads, an underfill material is applied to the existing semiconductor die assembly.

Referring to drawing FIG. 8B, the wires 151 connecting the leads 112 to the bond pads 124 are shown with more clarity. As illustrated, one-half of each bond pad 124 located along centerline 100 of die 102 is shown with one end of a wire 151 bonded thereto.

Figure 9A:
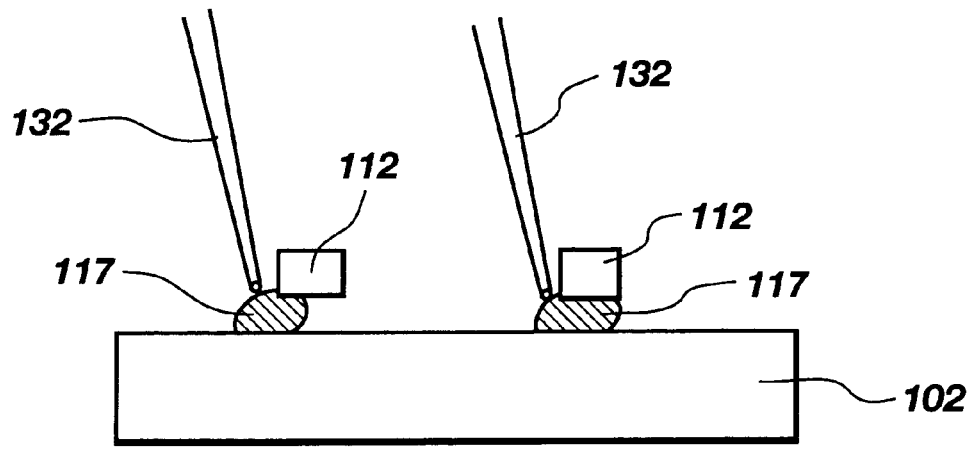
FIG. 9A depicts a partial cross-sectional end view of a semiconductor die assembly wherein a first method of dispensing underfill is used.

As illustrated in FIG. 9A, which depicts a partial cross-sectional end view of a semiconductor die assembly, underfilling is accomplished by applying the underfill material 117 along a longitudinal edge 136 of the lead 112. The underfill material 117 is applied with an underfill dispenser 132, such as a syringe having a suitable nozzle thereon or any other dispensing means known in the all, such as sprinkling the underfill material onto the semiconductor die 102 in the area between the leads 112, dripping the underfill material onto the semiconductor die 102, spraying the underfill material onto the semiconductor die 102, write dispensing the underfill material onto the semiconductor die 102, etc. Capillary attraction between the underfill material 117 and the lead and die surfaces causes the underfill material 117 to flow into the gap between the lead 112 and the die 102. FIG. 9A illustrates, from left to right, the flow characteristics of the underfill material 117 due to capillary action as the underfill process is carried out.

Figure 9B:
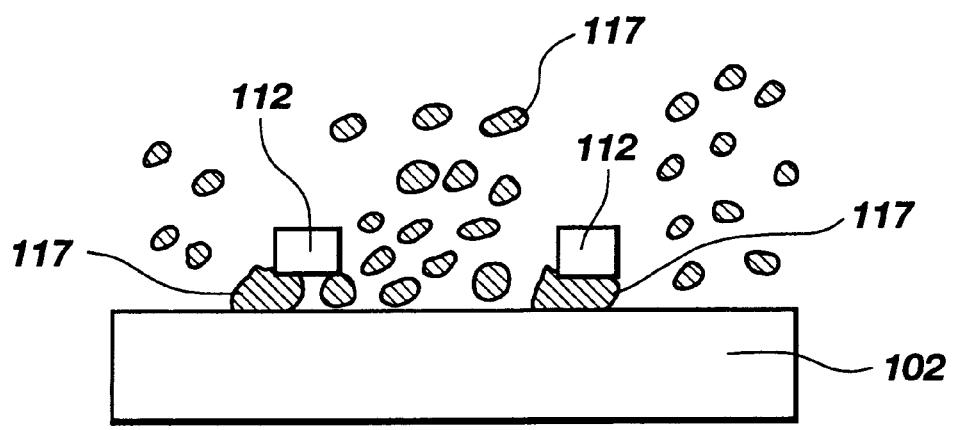
FIG. 9B depicts a partial cross-sectional end view of a semiconductor die assembly wherein a second method of dispensing underfill is used.

As illustrated in FIG. 9B, which depicts a partial cross-sectional end view of a semiconductor die assembly, underfilling is accomplished by sprinkling, dripping, spraying, write dispensing, etc. the underfill material 117 along a longitudinal edge 136 of the lead 112. The underfill material 117 is applied in suitable well known manners in the art for the sprinkling, dripping, spraying, write dispensing, etc. onto the die 102 in the area between the leads 112. Capillary attraction between the underfill material 117 and the lead and die surfaces causes the underfill material 117 to flow into the gap between the lead 112 and the die 102.

The underfill material is typically a polymeric material, such as an epoxy or an acrylic resin. The underfill material 117 typically has a thermal coefficient of expansion that approximates that of the die 102 and/or the lead 112 to help minimize stress placed on either the die 102 or the lead 112 during the operation of the die caused by the heating of the underfill material 117. To promote filling of the gap between the die 102 and the lead 112, the viscosity of the underfill material 117 is controlled, taking into account the flow characteristics of the underfill material (including adhesion and surface tension properties), the material characteristics of the die 102, the material characteristics of the lead 112, and the size of the gap. Preferably, the viscosity of the underfill material 117 should be left low enough to readily prevent the flow of the underfill material 117 significantly beyond the perimeter of the lead 112, or in the alternative, beyond the perimeter of the die 102.

After application of the underfill material 117, the material is cured or dried by heat, ultraviolet light, radiation, or other suitable means in order to form a solid mass.

Figure 10:
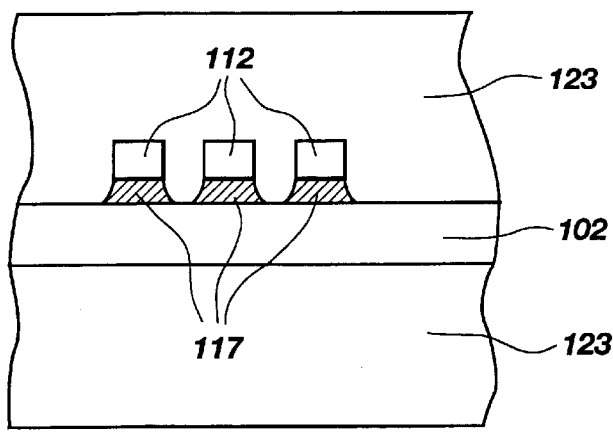
FIG. 10 depicts a partial cross-sectional side view of the packaged SOJ semiconductor device of FIG. 7A.
Figure 11:
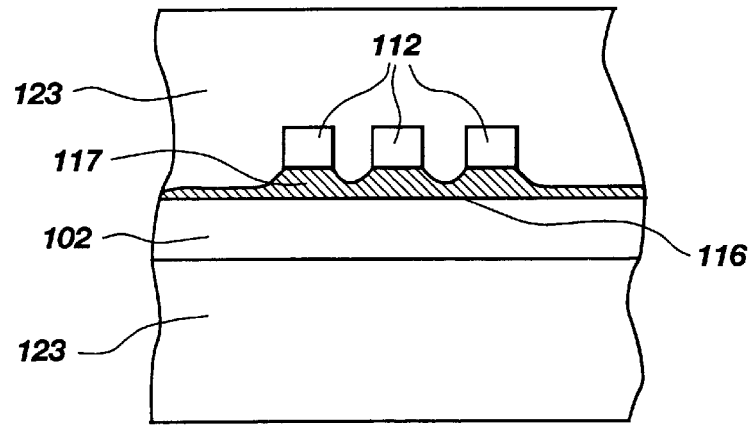
FIG. 11 depicts a partial cross-sectional side view of the embodiment of a packaged SOJ semiconductor device of FIG. 7A.

As illustrated in FIGS. 10 and 11, the cured underfill material 117 can possess various configurations, depending on the specific method of underfilling utilized and on the amount of underfill material 117 used. FIG. 10 depicts an arrangement, or first embodiment of the invention, wherein the underfill material 117 is substantially contained within the gap between the die 102 and the lead 112. Due to the forces of adhesion and surface tension inherent in the underfill material 117, the exposed surface of the underfill material will form a lune, meniscus, or crescent-shaped configuration. This crescent-shaped configuration prevents the formation of bubbles or air pockets that may occur due to non-uniform encapsulant flow during the encapsulation process by eliminating angles formed in the gap.

FIG. 11 depicts an alternative arrangement, or second embodiment of the invention, wherein the underfill material 117, in addition to filling the gap between the die 102 and the lead 112, substantially covers the active surface 116 of the die 102. As previously described in FIG. 9, the underfill material 117 is applied with an underfill dispenser 132 along a longitudinal edge 136 of the lead 112 or sprinkled onto the surface of the die 102. However, in the present embodiment, an excess of underfill material 117 is applied onto the active die surface 116 of die 102 so as to substantially cover the entire active surface of die 102. Due to the use of an overflow of underfill material, the amount of underfill material used and the specific placement of the underfill dispenser need not be precisely calibrated.

Figure 12:
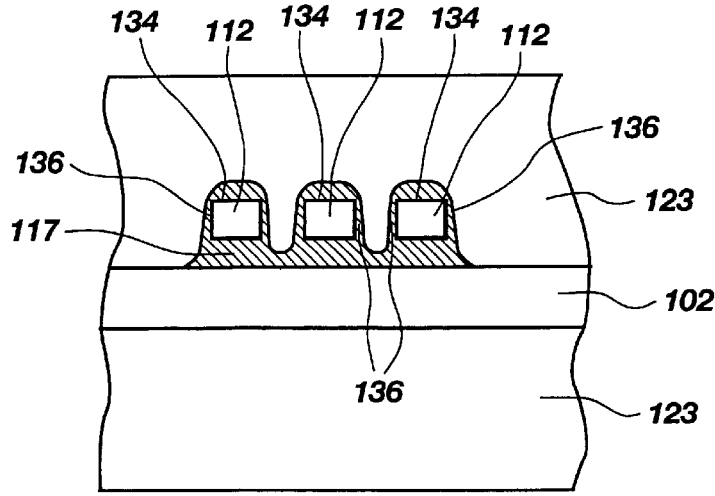
FIG. 12 depicts a partial cross-sectional side view of an embodiment of a packaged SOJ semiconductor device of FIG. 7A.

FIG. 12 depicts an another alternative arrangement, or third embodiment of the invention, wherein the underfill material 117 is applied on top of lead 112. Unlike the underfill process described in FIG. 9, the present underfill method is accomplished by applying the underfill material 117 onto the top surface 134 of lead 112. A sufficient amount of underfill material 117 is applied to cover top surface 134, cover the longitudinal edges 136 of lead 112, and fill the gap between the die 102 and the lead 112. Excess underfill material 117 then flows along the longitudinal edges 136 and fills the gap through capillary action, as previously described. The present embodiment further enhances the stability of the free end of the lead finger, immobilizing and encapsulating the lead 112 with underfill material, during the die assembly molding process.

Figure 13:
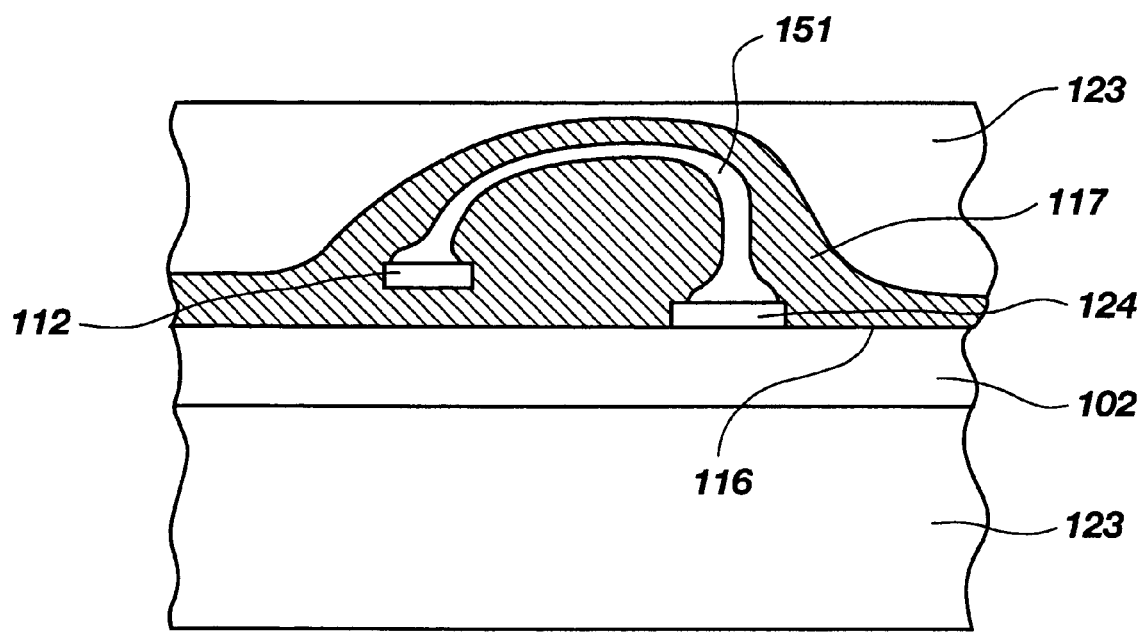
FIG. 13 depicts a partial cross-sectional side view of another embodiment of a packaged SOJ semiconductor device of FIG. 7A.

FIG. 13 depicts yet another alternative arrangement, or fourth embodiment of the invention, wherein the underfill material 117 is applied either on top of lead 112 or on top of the lead 112 and the surface of the die 102, thereby covering and underfilling at least a portion of lead 112, at least a portion of active surface 116 of die 102, and wire 151 bonded to lead 112 and bond pad 124. Unlike the underfill process described in FIG. 9, the present underfill method is accomplished by applying the underfill material 117 onto the top surface 134 of lead 112. A sufficient amount of underfill material 117 is applied to cover top surface 134, cover the longitudinal edges 136 of lead 112 and fill the gap between the die 102 and the lead 112, cover at least a portion of the active surface 116 of die 102, and cover wire 151. The underfill material 117 flows along the longitudinal edges 136 and fills the gap through capillary action, as previously described. The present embodiment further enhances the stability of the free end of the lead finger, immobilizing and encapsulating the lead 112 as well as wire 151 with underfill material, during the die assembly molding process. The packaging material 123 encapsulates the die 102 and leads 112 during the molding process as described hereinbefore.

Thus, it will be appreciated by those of ordinary skill in the art that several different underfill coating methods and arrangements may be employed, as illustrated, with a single lead frame and die design, to prevent compound filler particles from flowing into the gaps between the active surface of the die and the lead. While the invention has thus far been described in terms of reducing the incidence of die coat damage due to filler particles, it should also be recognized that the use of the underfill material between the leads and the die enhances the uniformity of the flow front of encapsulant, and reduces the tendency toward formation of voids by promoting flow of the encapsulant over and around the leads and over the die surface. It is believed that improved PRT (Preconditioned Reflow Test, also termed a "popcorn" test by virtue of its deleterious effect on substandard package integrity) performance, indicative of reduced levels of moisture in the cured encapsulant, will be realized. However, this has yet to be empirically demonstrated.

The present invention has been disclosed in terms of certain preferred embodiments as illustrated and described herein. However, those of ordinary skill in the art will recognize and appreciate that it is not so limited, and that many additions, deletions and modifications to, and combinations of, the disclosed embodiments may be effected without departing from the scope of the invention as hereinafter claimed. For example, the method of underfilling may include any known or contemplated method in the art. Various types of LOC lead frame assemblies, including multi-layer LOC lead frames such as a two-frame LOC assembly described in the above-referenced U.S. Pat. No.

5,461,255, may be adapted to the present invention. Further, the invention is not limited to a particular arrangement of leads, or to a particular lead cross-section or configuration.

What is claimed is:

1. A method of assembling a semiconductor die to a lead frame, said method comprising the steps of:

providing a lead frame having a plurality of lead members, at least one lead member of said plurality of lead members having longitudinal edges, having a top surface, having a bottom surface, having a lead end portion connected to a portion of the lead frame, having a length, having a thickness, and having a free end portion;

providing a die having an active surface, having at least one bond pad thereon, and having at least one outer edge;

superimposing a portion of one of the top surface and the bottom surface of the at least one lead member of the plurality of lead members of said lead frame on said die with said active surface of said die lying adjacent the portion of one of the top surface and the bottom surface of the at least one lead member of the plurality of lead members of said lead frame, the portion of the one of the top surface and bottom surface of the at least one lead member of the plurality of lead members extending over a portion of the active surface of said die, a gap formed between the portion of one of the top surface and the bottom surface of the at least one lead member of the plurality of lead members of the lead frame and a portion of the active surface of said die; and applying an underfill material around at least a portion of said at least one lead member of said plurality of lead members, the underfill material flowing by capillary action into the gap between the portion of one of the top surface and the bottom surface at least one lead member of said plurality of lead members and the portion of one of the top surface and the bottom surface active surface of said die.

2. The method of claim 1, further comprising the step of: curing said underfill material.

3. The method of claim 1, further comprising the step of: drying said underfill material.

4. The method of claim 1, further comprising the step of: adhering said at least one lead member of said plurality of lead members to said active surface of said die.

5. The method of claim 1, further comprising the step of: adhering each lead member of said plurality of lead members to said active surface of said die.

6. The method of claim 1, wherein the step of applying an underfill material includes:

applying said underfill material substantially between each lead member of said plurality of lead members and said active surface of said die.

7. The method of claim 1, wherein the step of applying an underfill material includes:

applying said underfill material at a location substantially adjacent to said longitudinal edges of said at least one lead member of said plurality of lead members.

8. The method of claim 1, wherein the step of applying an underfll material includes:

applying said underfill material substantially over said top surface of said at least one lead member.

9. The method of claim 1, wherein the step of applying an underfill material includes:

applying said underfill material substantially on a portion of said active surface of said die.

10. The method of claim 9, wherein a sufficient quantity of the underfill material is applied to substantially cover said active surface of said die.

11. The method of claim 1, wherein said underfill material is applied with an underfill dispenser.

12. The method of claim 1, wherein said underfill dispenser is a syringe.

13. The method of claim 1, wherein said underfill material is sprinkled on said die.

14. The method of claim 1, wherein said underfill material is dripped on said die.

15. The method of claim 1, wherein said underfll material is sprayed on said die.

16. The method of claim 1, wherein said underfill material is write dispensed on said die.

17. The method of claim 1, wherein the step of applying an underfill material includes:

applying said underfill material substantially over a portion of said top surface of said at least one lead member and a portion of said active surface of said die.

18. The method of claim 1, wherein the method further comprises the step of:

bonding at least one wire to a portion of said at least one lead member and said at least one bond pad on said active surface of said die.

19. The method of claim 18, wherein the step of applying an underfill material includes:

applying said underfill material substantially on a portion of said at least one lead member, a portion of said active surface of said die, and a portion of said at least one wire.

20. The method of claim 18, wherein a sufficient quantity of underfill material is applied to substantially cover a portion of said active surface of said die and a portion of said at least one wire.

21. A method of transfer molding a plastic package about a die assembly using a molding compound including filler particles, said method of transfer molding comprising the steps of:

providing a lead frame having a plurality of lead members, at least one lead member of said plurality of lead members having longitudinal edges, having a top surface, having a bottom surface, having a lead end portion connected to a portion of the lead frame, having a length, having a thickness, and having a free end portion;

providing a die having an active surface having at least one bond pad thereon and having at least one outer edge;

superimposing said lead frame on said die with said active surface lying adjacent said lead frame and a portion of the free end portion of said at least one lead member of the plurality of lead members extending over the at least one outer edge of said die over a portion of the active surface of said die, a gap being formed between the portion of the free end portion of the at least one lead member of the plurality of lead members and the active surface of said die;

applying an underfill material between the portion of the free end portion of said at least one lead member of said plurality of lead members and said active surface of said die;

disposing the lead frame having an underfill material disposed between the portion of the free end portion of at least one lead member of a plurality of lead members and the active surface of the die, said die being secured by its active surface to a portion of the free end portion of said at least one lead member of the plurality of lead member, in a lead over chip configuration in a mold cavity;

introducing a softened molding compound including filler particles therein into said mold cavity to form a plastic package around a portion of the lead frame and said die; and preventing flow of the softened molding compound into the gap between the portion of the free end portion of the at least one lead member of the plurality of lead members and the active surface of said dies thereby reducing stress on the active surface of said die attributable to contact of the filler particles in the softened molding compound with the portion of the free end portion of the at least one lead member and the active surface of said die by preventing filler the particles in the softened molding compound from flowing between said active surface of said die and said at least one lead member of the plurality of lead members during said transfer molding.

22. The method of claim 21, wherein said filler particles are prevented from flowing between said active surface of said die and said at least one lead member of the plurality of lead members by underfill material.

23. The method of claim 22, wherein said underfill material is substantially located between said active surface of said die and said at least one lead member of the plurality of lead members.

24. The method of claim 22, wherein said underfill material is substantially located between said active surface of said die and said plurality of lead members.

\* \* \* \* \*

UNITED STATES PATENT AND TRADEMARK OFFICE
CERTIFICATE OF CORRECTION

PATENT NO : 5,960,258
DATED : September 28, 1999
INVENTOR(S) : Walter L. Moden

It is certified that error appears in the above-identified patent and that said Letters Patent are hereby corrected as shown below:

|  |  |  |
|---|---|---|
| Column 1, | line 9, | after "assembly" delete the comma; |
| Column 1, | line 9, | insert a comma after "and" and "particularly"; |
| Column 2, | line 2, | insert a comma after "environment"; |
| Column 5, | line 53, | change "inmore" to --more--; |
| Column 7, | line 59, | after "underfill" insert --117--; |
| Column 8, | line 8, | delete the comma after "lead 112"; |
| Column 8, | line 28, | delete "double-dashed"; |
| Column 8, | line 30, | delete "dashed"; |
| Column 8, | line 42, | after "elongated" insert --adhesive--; |
| Column 8, | line 60, | after "longitudinal edge 136" insert --(not shown)--; |
| Column 9, | line 12, | after "longitudinal edge 136" insert --(not shown)--; |
| Claim 21, Column 13, | line 12, | change "dies" to --die--; and |
| Claim 21, Column 13, | line 17, | after "preventing" change "filler the" to --the filler--. |

Signed and Sealed this

Tenth Day of April, 2001

Attest:

NICHOLAS P. GODICI

*Attesting Officer*  *Acting Director of the United States Patent and Trademark Office*